US008385026B2

(12) United States Patent
Carey et al.

(10) Patent No.: US 8,385,026 B2
(45) Date of Patent: Feb. 26, 2013

(54) TUNNELING MAGNETORESISTIVE (TMR) READ HEAD WITH LOW MAGNETIC NOISE

(75) Inventors: Matthew J. Carey, San Jose, CA (US); Jeffrey R. Childress, San Jose, CA (US); Stefan Maat, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 734 days.

(21) Appl. No.: 12/545,776

(22) Filed: Aug. 21, 2009

(65) Prior Publication Data
US 2011/0043950 A1 Feb. 24, 2011

(51) Int. Cl.
*G11B 5/33* (2006.01)
(52) U.S. Cl. .................................................. 360/324.2
(58) Field of Classification Search .................. None
See application file for complete search history.

(56) References Cited

U.S. PATENT DOCUMENTS

| | | | |
|---|---|---|---|
| 7,245,462 B2 * | 7/2007 | Huai et al. | 360/324.11 |
| 7,580,227 B2 * | 8/2009 | Sato et al. | 360/313 |
| 7,961,439 B2 * | 6/2011 | Sato et al. | 360/324 |
| 2001/0021089 A1 * | 9/2001 | Miyauchi et al. | 360/324.2 |
| 2005/0024788 A1 * | 2/2005 | Sato et al. | 360/324 |
| 2005/0041342 A1 * | 2/2005 | Huai et al. | 360/324.12 |
| 2007/0201169 A1 | 8/2007 | Ide et al. | |
| 2008/0198514 A1 | 8/2008 | Jogo et al. | |
| 2008/0268290 A1 | 10/2008 | Carey et al. | |
| 2009/0027813 A1 | 1/2009 | Carey et al. | |
| 2009/0168266 A1 | 7/2009 | Sato et al. | |

OTHER PUBLICATIONS

Yilgin et al., Japanese Journal of Applied Physics, vol. 46, No. 9, 2007, pp. L205-L208.

Miyazaki, et al., "Recent progress in large tunnel magnetoresistance junctions", Mar. 6, 2008 1, Aachen, Germany (WEB Publication).
Bilzer et al., "Study of the dynamic magnetic properties of soft CoFeB films", J. of Appl. Phys. 100, 053903 (2006).
Kubota et al., "Half-metallicity and Gilbert damping constant in Co2FexMn1-xSi Heusler alloys depending on the film composition", Appl. Phys. Lett. 94, 122504 2009.
Yiilgin et al., "Intrinsic Gilbert Damping Constant in Co2MnAl Heusler Alloy Films", IEEE Transactions on Magnetics, vol. 41, No. 10, Oct. 2005 2799.
Mizukami, et al. "Low damping constant for Co2FeAl Heusler alloy films and its correlation with density of states", J. Appl. Phys. 105, 07D306 (2009).
Tserkovnyak et al., "Enhanced Gilbert Damping in Thin Ferromagnetic Films", Phys Rev Lett, vol. 88, No. 11, Mar. 18, 2002, 117601.
Smith et al., "Thermal and Spin-Torque Noise in CPP (TMR and/or GMR) Read Sensors", IEEE Transactions on Magnetics, vol. 42, No. 2, Feb. 2006, pp. 114-119.
Maat et al., "Current perpendicular to the plane spin-valves with CoFeGe magnetic layers", Appl. Phys. Lett. 93, 143505 (2008), Published Oct. 10, 2008.

* cited by examiner

*Primary Examiner* — David D Davis
(74) *Attorney, Agent, or Firm* — Thomas R. Berthold

(57) ABSTRACT

A tunneling magnetoresistance (TMR) device, like a TMR read head for a magnetic recording disk drive, has low magnetic damping, and thus low mag-noise, as a result of the addition of a ferromagnetic backing layer to the ferromagnetic free layer. The backing layer is a material with a low Gilbert damping constant or parameter α, the well-known dimensionless coefficient in the Landau-Lifshitz-Gilbert equation. The backing layer may have a thickness such that it contributes up to two-thirds of the total moment/area of the combined free layer and backing layer. The backing layer may be formed of a material having a composition selected from $(Co_xFe_{(100-x)})_{(100-y)}X_y$, $(Co_2Mn)_{(100-y)}X_y$, and $(Co_2Fe_xMn_{(1-x)})_{(100-y)}X_y$, where X is selected from Ge, Al and Si, and $(Co_2Fe)_{(100-y)}Al_y$, where y is in a range that results in a low damping constant for the material.

13 Claims, 2 Drawing Sheets

TUNNELING MAGNETORESISTIVE (TMR) READ HEAD WITH LOW MAGNETIC NOISE

BACKGROUND OF THE INVENTION

1. Field of the Invention

The invention relates generally to tunneling magnetoresistance (TMR) devices, and more particularly to a TMR read head with low magnetic noise for use in magnetic recording disk drives.

2. Description of the Related Art

A tunneling magnetoresistance (TMR) device, also called a magnetic tunneling junction (MTJ) device, is comprised of two ferromagnetic layers separated by a thin insulating tunneling barrier layer. The barrier layer is typically made of a metallic oxide, such as alumina ($Al_2O_3$), $TiO_2$, or MgO, that is so sufficiently thin that quantum-mechanical tunneling of charge carriers occurs between the two ferromagnetic layers. This quantum-mechanical tunneling process is electron spin dependent, which means that an electrical resistance measured when applying a sense current across the junction depends on the spin-dependent electronic properties of the ferromagnetic and barrier layers, and is a function of the relative orientation of the magnetizations of the two ferromagnetic layers. The magnetization of the first ferromagnetic layer is designed to be pinned, while the magnetization of the second ferromagnetic layer is designed to be free to rotate in response to external magnetic fields. The relative orientation of their magnetizations varies with the external magnetic field, thus resulting in change in the electrical resistance. The TMR device is usable as a memory cell in a nonvolatile magnetic random access memory (MRAM) array, as described in U.S. Pat. No. 5,640,343, and as TMR read head in a magnetic recording disk drive, as described in U.S. Pat. No. 5,729,410.

FIG. 1 illustrates a cross-sectional view of a conventional TMR read head 10. The TMR read head 10 includes a bottom "fixed" or "pinned" ferromagnetic (FM) layer 18, an insulating tunneling barrier layer 20, and a top "free" FM layer 32. The TMR read head 10 has bottom and top nonmagnetic electrodes or leads 12, 14, respectively, with the bottom nonmagnetic electrode 12 being formed on a suitable substrate. The FM layer 18 is called the "pinned" layer because its magnetization is prevented from rotation in the presence of an applied magnetic field in the desired range of interest for the TMR device, i.e., the magnetic field from a recorded region of the magnetic layer in a magnetic recording disk. The magnetization of the pinned FM layer 18 can be fixed or pinned by being formed of a high-coercivity film or by being exchange-coupled to an antiferromagnetic (AF) "pinning" layer. The pinned FM layer 18 may be replaced by an antiparallel (AP) pinned or flux-closure structure, where two ferromagnetic layers are separated by an antiparallel coupling (APC) spacer layer and thus antiparallel-coupled to form a flux closure, as described in U.S. Pat. No. 5,465,185. The magnetization of the free FM layer 32 is free to rotate in the presence of the applied magnetic field in the range of interest. In the absence of the applied magnetic field, the magnetizations of the FM layers 18 and 32 are aligned generally perpendicular in the TMR read head 10. The relative orientation of the magnetizations of the FM layers 18, 32 determines the electrical resistance of the TMR device.

For TMR read heads, thermally-induced magnetic noise (sometimes called "mag-noise") has become an increasingly relevant problem. The effect of thermal or other energetic excitations on the free FM layer becomes increasingly important as the free layer volume (and therefore its magnetic energy) is reduced. In particular, mag-noise is proportional to the TMR signal. Consequently, for sensors with very high TMR, mag-noise becomes the dominant source of noise and limits the overall signal-to-noise ratio (SNR) of the sensor.

What is needed is a TMR read head with a free ferromagnetic layer with low mag-noise.

SUMMARY OF THE INVENTION

The invention relates to a TMR device, like a TMR read head, that has low magnetic damping, and thus low mag-noise, as a result of the addition of a ferromagnetic backing layer to the ferromagnetic free layer. The backing layer is located on the surface of the free layer opposite the surface adjacent to the tunneling barrier layer. The backing layer is a ferromagnetic material with a low Gilbert damping constant or parameter a, the well-known dimensionless coefficient in the Landau-Lifshitz-Gilbert equation. The damping parameter a is preferably less than or equal to 0.005. The backing layer has a thickness such that its magnetic moment/area is less than two-thirds the total moment/area of the combined free layer and backing layer.

The backing layer is preferably formed of a low-damping material having the composition $(Co_xFe_{(100-x)})_{(100-y)}X_y$, where X is selected from germanium (Ge), silicon (Si) and aluminum (Al), and the value y is in a range that results in a low damping constant for the material, preferably less than or equal to 0.005. Alternatively, the backing layer may be formed of materials having the compositions $(Co_2Mn)_{(100-y)}X_y$, and $(Co_2Fe_xMn_{(1-x)})_{(100-y)}X_y$, where X is selected from Ge, Si and Al, and $(Co_2Fe)_{(100-y)}Al_y$, where y is in a range that results in a low damping constant for the material, less than or equal to 0.005.

Because the purpose of the backing layer is to suppress the mag-noise in the free layer without adversely affecting the performance of the TMR device, there is no advantage to use the material of the backing layer in the pinned ferromagnetic layer. Thus in the preferred embodiment of the TMR device the pinned ferromagnetic layer is made of a ferromagnetic material other than the material used for the backing layer.

The TMR device may also optionally include a thin diffusion barrier or diffusion prevention film between the free layer and the backing layer. This may be desirable to prevent diffusion of Ge or other materials from the backing layer and the diffusion of boron (B) or other materials from the free layer into the backing layer.

For a fuller understanding of the nature and advantages of the present invention, reference should be made to the following detailed description taken together with the accompanying figures.

DETAILED DESCRIPTION OF THE INVENTION

Figure 1:
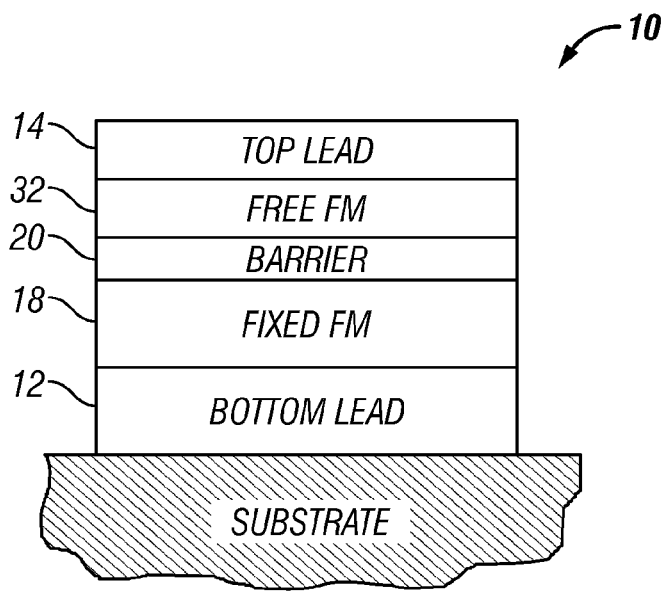
FIG. 1 is a cross-sectional view illustrating the structure of a conventional tunneling magnetoresistive (TMR) read head.
Figure 2:
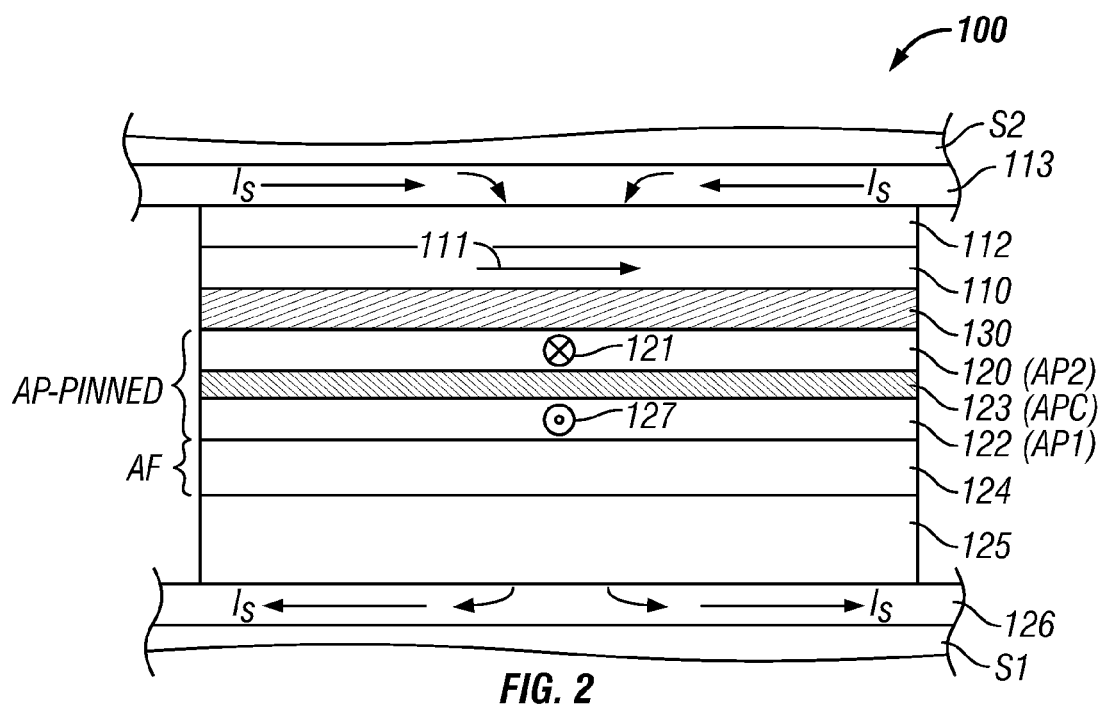
FIG. 2 is a cross-sectional view illustrating the detailed structure of a prior-art TMR read head.

FIG. 2 is a cross-sectional view illustrating the structure of a prior-art TMR read head 100 like that used in a magnetic recording disk drive. This cross-sectional view is a view of what is commonly referred to as the air-bearing surface (ABS) of the TMR read head 100. The TMR read head 100 includes a sensor stack of layers formed between two ferromagnetic shield layers S1, S2 that are typically made of electroplated NiFe alloy films. The lower shield S1 is typically smoothened by chemical-mechanical polishing (CMP) to provide a smooth surface for the growth of the sensor stack. The sensor stack includes a ferromagnetic reference layer 120 having a pinned magnetization 121 oriented transversely (away from the page), a ferromagnetic free layer 110 having a magnetization 111 that can rotate in the plane of layer 110 in response to transverse external magnetic fields from a recording disk, and an electrically insulating tunneling barrier layer 130, typically made of an oxide, such as magnesium oxide (MgO), alumina ($Al_2O_3$), or titanium oxide ($TiO_2$), between the ferromagnetic reference layer 120 and ferromagnetic free layer 110.

The reference layer 120 may be a conventional "simple" or single pinned layer that has its magnetization direction 121 pinned or fixed, typically by being exchange coupled to an antiferromagnetic layer. However, in the example of FIG. 2, the reference layer 120 is part of the well-known antiparallel (AP) pinned or flux-closure structure, also called a "laminated" pinned layer, as described in U.S. Pat. No. 5,465,185. The AP-pinned structure minimizes magnetostatic coupling of the reference layer 120 with the free layer 110. The AP-pinned structure includes the reference ferromagnetic (AP2) layer 120 and a lower or "keeper" ferromagnetic (AP1) layer 122 that are antiferromagnetically coupled across an AP coupling (APC) layer 123, such as Ru, Ir, Rh, or Cr, or alloys thereof. Due to the antiparallel coupling across the APC layer 123, the reference (AP2) and keeper (AP1) ferromagnetic layers 120, 122 have their respective magnetizations 121, 127 oriented antiparallel to each other. As a result, the net magnetization of the AP2 and AP1 ferromagnetic layers 120, 122 is so small that a demagnetizing field induced by the flux closure structure in the ferromagnetic free layer 110 is substantially minimized, and thus it becomes feasible for the TMR read head to operate optimally.

Located between the lower shield layer S1 and the AP-pinned structure are seed layer 125 and an antiferromagnetic (AF) pinning layer 124. The seed layer 125 facilitates the AF pinning layer 124 to grow a microstructure with a strong crystalline texture and thus develop strong antiferromagnetism. The seed layer 125 may be a single layer or multiple layers of different materials. The AF pinning layer 124 thus strongly exchange-couples to the ferromagnetic keeper layer 122, and thereby rigidly pins the magnetization 127 of the ferromagnetic keeper layer 122 in a direction perpendicular to and away from the ABS. The antiparallel coupling across the APC layer 123 then subsequently rigidly pins the magnetization 121 of the ferromagnetic reference layer 120 in a direction perpendicular to and towards the ABS, and antiparallel to magnetization 127. As a result, the net magnetization of the ferromagnetic AP2 and AP1 layers 120, 122 is rigidly pinned, and thus the optimal operation of the TMR read head is ensured. Instead of being pinned by an AF layer, the AP1 layer 122 may have its magnetization 127 pinned by a hard magnetic layer such as $Co_{100-x}Pt_x$ or $Co_{100-x-y}Pt_xCr_y$ (where x is between about and 8 and 30 atomic percent). The AP-pinned structure may also be "self-pinned". In a "self pinned" sensor the AP1 and AP2 layer magnetization directions 127, 121 are typically set generally perpendicular to the disk surface by magnetostriction and the residual stress that exists within the fabricated sensor.

Located between the ferromagnetic free layer 110 and the upper shield layer S2 is a layer 112, sometimes called a capping or cap layer. The layer 112 protects the ferromagnetic free layer 110 from chemical and mechanical damages during processing, so that ferromagnetic free layer 110 maintains ferromagnetic properties suitable for a read head.

In the presence of external magnetic fields in the range of interest, i.e., magnetic fields from written data on the recording disk, while the net magnetization of the ferromagnetic layers 120, 122 remains rigidly pinned, the magnetization 111 of the ferromagnetic free layer 110 will rotate in responses to the magnetic fields. Thus when a sense current $I_S$ flows from the upper shield layer S2 perpendicularly through the sensor stack to the lower shield layer S1, the magnetization rotation of the ferromagnetic free layer 111 will lead to the variation of the angle between the magnetizations of the ferromagnetic reference layer 120 and the ferromagnetic free layer 110, which is detectable as the change in electrical resistance.

Because the sense current is directed perpendicularly through the stack of layers between the two shields S1 and S2, the TMR read head 100 is a current-perpendicular-to-the-plane (CPP) read head. Another type of CPP read head is the well-known giant magnetoresistance (GMR) spin-valve read head, which does not use an electrically insulating tunneling barrier layer between the free and pinned ferromagnetic layers, but an electrically conducting spacer layer, which is typically formed of copper (Cu).

FIG. 2 shows optional separate electrical leads 126, 113 between shields S1, S2, respectively, and the sensor stack. Leads 126, 113 may be formed of Ta, Ru, or Rh. The leads are optional and may be used to adjust the shield-to-shield spacing. If the leads 126 and 113 are not present, the bottom and top shields S1 and S2 are used as electrical leads. The ferromagnetic keeper, reference and free layers 122, 120, and 110 are typically formed of a CoFe, CoFeB or NiFe film, or formed of multiple layers comprising these films. The seed layer 125 is typically formed of multiple layers comprising Ta/NiFeCr/NiFe, Ta/NiFe, Ta/Ru or Ta/Cu films. The AFM pinning layer 124 is typically made of an FeMn, NiMn, PtMn, IrMn, PdMn, PtPdMn or RhMn film. The cap layer 112 is typically made of a Ru, Ti, or Ta film or a multilayer thereof.

While the TMR read head 100 shown in FIG. 2 is a "bottom-pinned" read head because the AP-pinned structure is below the free layer 110, the free layer 110 can be located below the AP-pinned structure. In such an arrangement the layers of the AP-pinned structure are reversed, with the AP2 layer 120 on top of and in contact with the barrier layer 130.

It is known from published reports of theoretical calculations that TMR devices with MgO tunneling barriers, specifically Fe/MgO/Fe, CoFe/MgO/CoFe, and Co/MgO/Co tunnel junctions, should exhibit a very large magnetoresistance due to coherent tunneling of the electrons of certain symmetry. However, these calculations are based on tunnel junctions having (001) epitaxy and perfect crystallinity. For CoFe/MgO/CoFe tunnel junctions it is known that magnetoresistance is low due to inferior crystallinity of the MgO barrier. However, it has been found that when CoFeB amorphous layers are used in place of CoFe layers in the junctions, higher magnetoresistance (greater than 200% at room temperature) was observed after annealing. The amorphous CoFeB is known to promote high quality crystallization of the MgO into the (001) direction, while itself crystallizing in a favorable structure after annealing. Thus a TMR device with a CoFeB/MgO/CoFeB tunnel junction is a common type of TMR device for use in present and future TMR read heads.

For TMR read heads, thermal-induced magnetic noise (sometimes called "mag-noise") has become an increasingly relevant problem. The effect of thermal or other energetic excitations on the free layer becomes increasingly important as the free layer volume (and therefore its magnetic energy) is reduced. Because mag-noise is also proportional to the TMR signal, if the TMR is large then mag-noise is the dominant noise source in the sensor and will limit the achievable signal-to-noise ratio (SNR). Thus it is desirable to design TMR structures in which mag-noise is suppressed. It is known that the use of a free layer material with a low magnetic damping parameter ($\alpha$) will reduce the mag-noise. The parameter $\alpha$ is the Gilbert damping constant or parameter and is a dimensionless coefficient in the well-known Landau-Lifshitz-Gilbert equation:

$$\frac{d}{dt}\vec{M} = -\gamma \vec{M} \times \vec{H} + \alpha \vec{M} \times \frac{d}{dt}\vec{M}$$

In this invention, the conventional TMR read head like that shown in FIG. 2, with a conventional free layer, is improved by the addition of a ferromagnetic backing layer to the free layer, where the backing layer is a material with a low Gilbert damping parameter, preferably less than or equal to 0.005. The ferromagnetic backing layer may have a thickness such that it contributes up to two-thirds of the total moment/area of the combined free layer and backing layer.

CoFe and CoFeB alloys that are normally used as top electrode materials exhibit higher Gilbert damping constants, greater than 0.005. For CoFe, the magnetic damping parameter is approximately 0.013 and does not change significantly upon annealing. For CoFeB, the magnetic damping parameter in $Co_{80}Fe_{20}$ and $Co_{72}Fe_{18}B_{10}$ films of thickness between 50 and 400 Å was investigated by C. Bilzer et al., "Study of the dynamic magnetic properties of soft CoFeB films", *J. of Appl. Phys.* 100, 053903 (2006). There the CoFeB layer was measured to have a magnetic damping parameter of greater than 0.006 before annealing. After the typical annealing used for TMR structures to improve magnetoresistive properties by crystallization, and to induce exchange bias, the damping parameter increased to greater than 0.012 due to the crystallization of the CoFeB.

The invention is based on the discovery that certain high-spin-polarization germanium-containing materials, like $(Co_xFe_{(100-x)})_{(100-y)}Ge_y$ and $(Co_2Mn)_{(100-y)}Ge_y$, have exceptionally low damping constants for certain ranges of atomic percent (at %) Ge. Additionally, it has been reported that $(Co_2Fe_xMn_{(1-x)})Si$ has a low damping constant for certain values of x (Kubota et al., "Half-metallicity and Gilbert damping constant in $Co_2Fe_xMn_{1-x}Si$ Heusler alloys depending on the film composition", *Appl. Phys. Lett.* 94, 122504 2009).

It has also been reported that the Heusler alloys $Co_2MnAl$ and $Co_2FeAl$ may have low damping constants under certain conditions (Yilgin et al., "Intrinsic Gilbert Damping Constant in $Co_2MnAl$ Heusler Alloy Films", *IEEE TRANSACTIONS ON MAGNETICS*, VOL. 41, NO. 10, OCTOBER 2005 2799; Mizukami, et al. "Low damping constant for $Co_2FeAl$ Heusler alloy films and its correlation with density of states", *J. Appl. Phys.* 105, 07D306 (2009)).

Thus in this invention the backing layer preferably consists essentially of a low-damping material having the composition $(Co_xFe_{(100-x)})_{(100-y)}X_y$, where X is selected from Ge, Si and Al, and the value y is in a range that results in a low damping constant for the material, less than or equal to 0.005. The backing layer may also consist essentially of a material having a composition selected from $(Co_2Mn)_{(100-y)}X_y$ and $(Co_2Fe_xMn_{(1-x)})_{(100-y)}X_y$, where X is selected from Ge, Si and Al, and $(Co_2Fe)_{(100-y)}Al_y$, where y is in a range that results in a low damping constant for the material, preferably less than or equal to 0.005.

Figure 3:
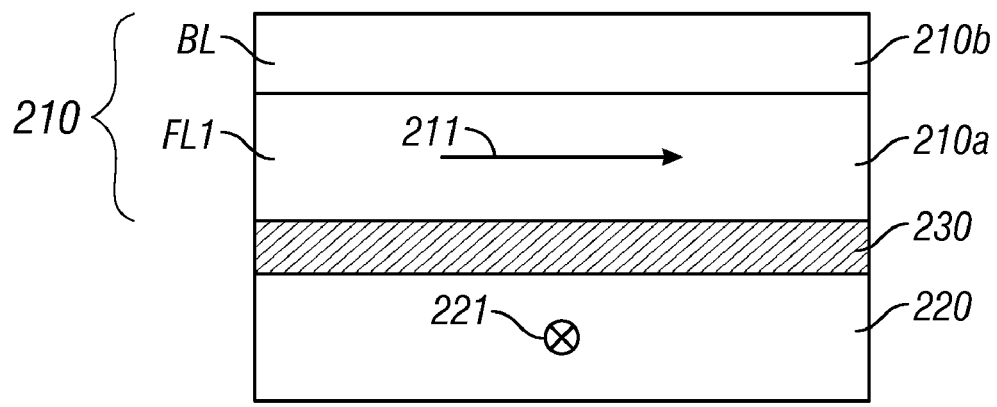
FIG. 3 is a cross-sectional view of a TMR read head with the improved free layer according to this invention.

FIG. 3 is a sectional view illustrating just the tunnel junction portion of the TMR read head according to this invention. The pinned ferromagnetic layer 220, which is the reference or AP2 layer if an AP-pinned structure is used, and the free ferromagnetic layer 210 are located on opposite surfaces of the tunneling barrier 230. The tunneling barrier 230 is preferably MgO. The free ferromagnetic layer 210 includes a first free ferromagnetic layer (FL1) 210a adjacent the barrier 230 and a ferromagnetic low-magnetic-damping backing layer (BL) 210b on FL1 opposite the FL1 surface adjacent barrier 230. FL1 210a is preferably a CoFe or CoFeB layer, or a CoFe/CoFeB bilayer.

The properties of BL 210b are not chosen to improve the overall performance of the TMR read head, but merely to suppress the mag-noise of the free layer 210. It is thus desirable to add the BL but without adversely affecting the known desirable performance of an otherwise conventional TMR read head. Thus the BL 210b should be as thin as possible, but still thick enough to reduce the magnetic damping constant of the free layer 210. A conventional free ferromagnetic layer in a TMR read head typically has a magnetic moment equivalent to a $Ni_{80}Fe_{20}$ layer with a thickness between about 40 to 90 Å. Thus the FL1 210a and BL 210b together should have approximately this value of magnetic moment/area. In one embodiment of this invention the FL1 may be formed of CoFeB, which, depending on B content, has a magnetic moment of about 700-1100 $emu/cm^3$, and the BL 210b may be formed of $(Co_{50}Fe_{50})_{(100-y)}Ge_y$, where y is between 10 and 30 atomic percent, which has a magnetic moment of about 1300 and 750 $emu/cm^3$, respectively. The BL should be as thin as possible but may contribute up to about two-thirds of the total moment/area of the free layer 210. Thus if the BL and FL1 are formed of materials that have approximately the same moments, the BL may have a thickness up to about twice the thickness of FL1.

The TMR device of FIG. 3 may also optionally include a thin diffusion barrier or diffusion prevention film between the FL1 210a and the BL 210b. This may be desirable to prevent diffusion of Ge or other materials from the BL into FL1 and the diffusion of B or other materials from FL1 into the BL. The diffusion barrier may be a film of NiFe having a thickness of about 2 to 8 Å. If a non-magnetic material like Ta is used for the diffusion barrier, then it should be thin enough that FL1 and BL still ferromagnetically couple, so a typical thickness would be between about 2 to 5 Å.

The pinned ferromagnetic layer 220 is preferably a CoFe or CoFeB layer, or a CoFe/CoFeB bilayer. Because the purpose of the BL 210b is to suppress the mag-noise in the free layer 210, there is no advantage to use the material of the BL in the pinned ferromagnetic layer 220, and in fact such use may adversely affect the performance of the TMR read head. Thus in the preferred embodiment of the TMR read head the pinned ferromagnetic layer 220 is made of a ferromagnetic material other than the material used for the BL 210b.

The TMR read head with the tunnel junction described above and shown in FIG. 3 is fabricated in the conventional manner, wherein the layers in the sensor stack are deposited by sputter deposition or other known thin-film disposition techniques, after which the stack is lithographically patterned and etched to define the desired dimensions for the read head. The structure is then annealed in the presence of an applied magnetic field to set the direction of the magnetization of the pinned ferromagnetic layer. The annealing is typically done at about 240° C. to 280° C. for about 3 to 5 hours. The annealing is done to improve magnetoresistive properties through CoFeB crystallization, improvement of MgO crystallinity, and to establish exchange bias between the antiferromagnet and the pinned layer structure. As deposited, the magnetic damping parameter of CoFeB is already greater 0.005. However, if the CoFeB is allowed to crystallize, its magnetic damping parameter will further increase. Depending on the composition of the BL, specific annealing conditions may be chosen to optimize the damping parameter in the BL or the average damping parameter for the TMR stack. Annealing temperatures up to 400° C. are generally possible without causing irreversible damage to the sensor.

Figure 4:
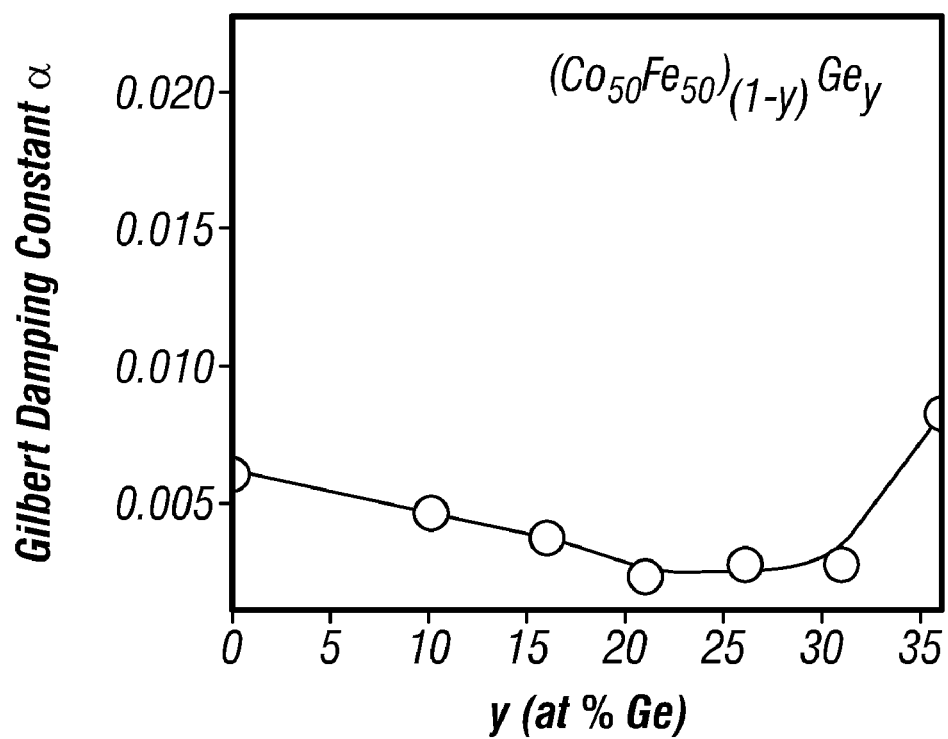
FIG. 4 is a graph of the Gilbert magnetic damping parameter a for 500 Å thick $(Co_{50}Fe_{50})_{(100-y)}Ge_y$ films after annealing for 5 hours at 245° C. as a function of y (the atomic percent of Ge).

FIG. 4 is a graph of the Gilbert magnetic damping parameter a for 500 Å thick $(Co_{50}Fe_{50})_{(100-y)}Ge_y$ films after annealing for 5 hours at 245° C. as a function of y (the at % of Ge). The magnetic damping parameter α is low, less than about 0.005, for Ge between about 5 to 33 at %, and is a minimum of about 0.003 between for Ge between about 20 to 30 at %. The Gilbert damping parameter is known to vary with the thickness of the ferromagnetic material. Thus references to a ferromagnetic material having a specified value or range of values of the Gilbert damping parameter α shall refer to the value or values for the "bulk" ferromagnetic material, i.e., for film thicknesses of at least about 500 Å. The measurements of the Gilbert magnetic damping parameter as shown in FIG. 4 were made using a broadband coplanar waveguide field-swept ferromagnetic resonance setup. The resonance field and the peak-to-peak line-width were determined by performing a least-square fit of the raw data using a first derivative of a Lorentzian line shape. The Gilbert damping parameter was extracted by line-width measurements of 500 Å thick films in which non-linear contributions to the line-width such as two-magnon-scattering are absent and the line-width is a good measure of the Gilbert damping parameter.

While the measured values in FIG. 4 were obtained for a CoFeGe composition with a Co/Fe ratio of 1.0, i.e., for $(Co_{50}Fe_{50})_{(100-y)}Ge_y$ films, this precise Co/Fe ratio is not required. The preferred Co/Fe ratio is between about 0.8 and 1.2, corresponding approximately to a composition of $(Co_xFe_{(100-x)})Ge$ where x is between about 45 and 55 in at %.

The $(Co_{50}Fe_{50})_{(100-y)}Ge_y$ alloy, like the conventional CoFe, is crystalline. This has been determined experimentally using X-ray diffraction analysis of $(Co_{50}Fe_{50})_{(100-y)}Ge_y$ films with y between 7 and 40. In all cases the diffraction pattern showed a peak corresponding to the (110), (220), and (211) planes after annealing at 245° C. for 5 hours. These annealing conditions are typical to initialize pinning of the pinned ferromagnetic layer with an antiferromagnet such as PtMn or IrMn.

Measurements of the Gilbert magnetic damping parameter a were also made for 500 Å thick $(Co_2Mn)_{(100-y)}Ge_y$ films after annealing for 5 hours at 245° C. as a function of y (the at. % of Ge). The results showed that a becomes less than about 0.005 beginning at about 25 at % Ge and becomes immeasurably low beyond about 26 at %. Because $(Co_2Mn)_{(100-y)}Ge_y$ becomes non-ferromagnetic around a Ge composition of about 40 at %, the acceptable range for Ge for a BL made with $(Co_2Mn)_{(100-y)}Ge_y$ is for y between about 25 to 33 at %.

Low damping parameter values have also been reported for a material similar to $(Co_2Mn)_{(100-y)}Ge_y$, wherein Si is substituted for Ge, and Fe is substituted for a portion of the Mn. (Kubota et al., "Half-metallicity and Gilbert damping constant in $Co_2Fe_xMn_{1-x}Si$ Heusler alloys depending on the film composition", *Appl. Phys. Lett.* 94, 122504 2009). The Gilbert damping parameter for a $(Co_2Fe_xMn_{(1-x)})Si$ material was reported to be less than 0.005 for x between about 0.2 to 0.5. Because of the low damping parameter values reported for this material where Si is alloyed with $Co_2Fe_xMn_{(1-x)}$, and the low measured damping parameter values for the material where Ge is alloyed with $Co_2Mn$, it is believed that materials having compositions of $(Co_2Mn)_{(100-y)}X_y$ and $(Co_2Fe_xMn_{(1-x)})_{(100-y)}X_y$, where X is selected from Ge and Si and x and y are chosen to be close to the measured and reported values, will have a low damping parameter, preferably less than or equal to 0.005.

The materials with the general compositions described above, such as CoFeGe and the Heusler alloy $(Co_2Mn)Ge$, are known to have high spin-polarization and thus have been suggested for use as both free and pinned ferromagnetic layers in giant magnetoresistance (GMR) sensors. High spin-polarization in the free and pinned ferromagnetic layers will result in large magnetoresistance when incorporated into a CPP GMR spin-valve sensor. However, in a GMR sensor, such as the well known CPP GMR spin-valve type read head, the limiting factor is not mag-noise but spin-torque-induced noise. The spin-torque-induced noise is a result of the much higher current densities in CPP GMR read heads than in TMR read heads. To counter the effect of spin-torque-induced noise it is desirable to increase the magnetic damping of the free layer. Thus high spin-polarization materials with low magnetic damping are not desirable for CPP GMR read heads.

For example, US 2008/0198514 A1 describes the use of a CoFeGe material, with various ranges of Co/Fe ratio and Ge composition, for both the entire free layer and entire pinned layer in a GMR read head. This reference describes experimental results that show high magnetoresistance and suggests that high magnetoresistance may also be obtained if the CoFeGe material is used in TMR read heads. However, the reference does not address the issues of spin-torque-induced noise in a GMR sensor and mag-noise in a TMR sensor and the competing effects of magnetic damping to address these issues.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A tunneling magnetoresistive (TMR) device comprising:
    a substrate;
    a pinned ferromagnetic layer having an in-plane magnetization direction;
    a free ferromagnetic layer having an in-plane magnetization direction substantially free to rotate in the presence of an external magnetic field; and
    an electrically insulating tunneling barrier layer between the pinned ferromagnetic layer and the free ferromagnetic layer;
    wherein the free ferromagnetic layer comprises a first ferromagnetic layer comprising an alloy of one or more of Co, Fe, Ni and B and a ferromagnetic backing layer, the first ferromagnetic layer being between the tunneling barrier layer and the backing layer and the backing layer having a thickness whereby the magnetic moment per unit area of the backing layer is less than two-thirds the total magnetic moment per unit area of the free ferromagnetic layer; and wherein the backing layer comprises a ferromagnetic material selected from the group consisting of $(Co_xFe_{(100-x)})_{(100-y)}Ge_y$, where the subscripts represent atomic percent, x is equal to or greater than 45 and less than or equal to 55, and y is equal to or greater than 5 and less than or equal to 33; $(Co_2Mn)_{(100-y)}Ge_y$, where the subscripts represent atomic percent, and y is equal to or greater than 25 and less than or equal to 33; $(Co_2Mn)_{(100-y)}Si_y$, where the subscripts represent atomic percent, and y is equal to or greater than 25 and less than or equal to 33; $(Co_2Fe_xn_{(1-x)})Ge$ where x is equal to or greater than 0.2 and less than or equal to 0.5; and $(Co_2Fe_xn_{(1-x)})Si$ where x is equal to or greater than 0.2 and less than or equal to 0.5.

2. The device of claim 1 wherein the backing layer ferromagnetic material is $(Co_xFe_{(100-x)})_{(100-y)}Ge_y$, and y is equal to or greater than 20 and less than or equal to 30.

3. The device of claim 1 wherein the free ferromagnetic layer has a magnetic moment per unit area equivalent to the moment per unit area of a $Ni_{80}Fe_{20}$ layer having a thickness of at least 40Å.

4. The device of claim 1 wherein the first free ferromagnetic layer is an alloy comprising Co, Fe and B and the tunneling barrier layer consists essentially of MgO.

5. The device of claim 1 further comprising a diffusion prevention located between and in contact with the first free ferromagnetic layer and the backing layer.

6. The device of claim 1 wherein the pinned ferromagnetic layer is formed of a ferromagnetic material other than the material of the backing layer.

7. The device of claim 1 wherein the pinned layer is located between the substrate and the free ferromagnetic layer.

8. The device of claim 1 wherein the free ferromagnetic layer is located between the substrate and the pinned layer.

9. The device of claim 1 wherein the pinned layer is an antiparallel (AP) pinned structure comprising a first AP-pinned (AP1) ferromagnetic layer having an in-plane magnetization direction, a second AP-pinned (AP2) ferromagnetic layer adjacent the tunneling barrier layer and having an in-plane magnetization direction substantially antiparallel to the magnetization direction of the AP1 layer, and an AP coupling (APC) layer between and in contact with the AP1 and AP2 layers.

10. The device of claim 9 wherein the AP-pinned structure is a self-pinned structure.

11. The device of claim 9 further comprising an antiferromagnetic layer exchange-coupled to the AP1 layer for pinning the magnetization direction of the AP1 layer.

12. The device of claim 9 further comprising a hard magnetic layer in contact with the AP1 layer for pinning the magnetization direction of the AP1 layer.

13. The device of claim 1 wherein the device is a magnetoresistive read head for reading magnetically recorded data from tracks on a magnetic recording medium, and wherein the substrate is a first shield formed of magnetically permeable material.

* * * * *